United States Patent
Ozeki et al.

(10) Patent No.: US 10,910,515 B2
(45) Date of Patent: Feb. 2, 2021

(54) METHOD OF MANUFACTURING A LIGHT-EMITTING DEVICE

(71) Applicant: NICHIA CORPORATION, Anan (JP)

(72) Inventors: Kenji Ozeki, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/666,698

(22) Filed: Oct. 29, 2019

(65) Prior Publication Data

US 2020/0135966 A1 Apr. 30, 2020

(30) Foreign Application Priority Data

Oct. 30, 2018 (JP) .................................. 2018-203915

(51) Int. Cl.
| | | |
|---|---|---|
| *H01L 33/00* | (2010.01) | |
| *H01L 33/56* | (2010.01) | |
| *H01L 51/56* | (2006.01) | |
| *H01L 25/13* | (2006.01) | |
| *H01L 23/31* | (2006.01) | |

(52) U.S. Cl.
CPC ...... *H01L 33/0095* (2013.01); *H01L 23/3107* (2013.01); *H01L 25/13* (2013.01); *H01L 33/56* (2013.01); *H01L 51/56* (2013.01); *H01L 2933/005* (2013.01)

(58) Field of Classification Search
CPC ..... H01L 33/0095; H01L 51/56; H01L 25/13; H01L 23/3107; H01L 2933/005; H01L 2933/0041; H01L 33/52–56
See application file for complete search history.

(56) References Cited

U.S. PATENT DOCUMENTS

| | | | | |
|---|---|---|---|---|
| 2005/0151147 A1* | 7/2005 | Izuno | .................... | H01L 33/505 257/98 |
| 2008/0308223 A1 | 12/2008 | Sakairi et al. | | |
| 2010/0207521 A1* | 8/2010 | Tamaki | ................... | H01L 24/97 313/506 |
| 2012/0049222 A1* | 3/2012 | Yoshizumi | .......... | H01L 25/0753 257/98 |
| 2012/0326341 A1* | 12/2012 | Cheng | .............. | B29D 11/00807 264/1.1 |
| 2013/0062649 A1* | 3/2013 | Hata | ...................... | H01L 33/501 257/98 |

(Continued)

FOREIGN PATENT DOCUMENTS

| | | |
|---|---|---|
| JP | 54-119644 A | 9/1979 |
| JP | 2002-350606 A | 12/2002 |

(Continued)

*Primary Examiner* — Bac H Au (74) *Attorney, Agent, or Firm* — Squire Patton Boggs (US) LLP (57) ABSTRACT

A method of manufacturing a light-emitting device includes providing a package having an upper surface and defining a recess, the recess having an opening at the upper surface. A light-emitting element is placed on a bottom surface of the recess of the package, and the recess of the package is filled with an uncured sealing member containing a silicone resin. The package is held in a liquid in a state in which the uncured sealing member is filled in the recess of the package, and the uncured sealing member is cured by heating the package in which the uncured sealing member is filled in the recess.

11 Claims, 8 Drawing Sheets

(56) References Cited

U.S. PATENT DOCUMENTS

| | | | | |
|---|---|---|---|---|
| 2013/0328091 A1* | 12/2013 | Fuke | ............... | H01L 33/60 |
| | | | | 257/98 |
| 2013/0334558 A1* | 12/2013 | Pindl | ............... | H01L 33/50 |
| | | | | 257/98 |
| 2013/0341666 A1* | 12/2013 | Yoshida | ............ | H01L 33/501 |
| | | | | 257/98 |
| 2014/0021503 A1* | 1/2014 | Yoshida | ............ | H01L 33/641 |
| | | | | 257/98 |
| 2016/0204321 A1* | 7/2016 | Naka | ............... | H01L 33/44 |
| | | | | 257/98 |

FOREIGN PATENT DOCUMENTS

| | | |
|---|---|---|
| JP | 2002-353512 A | 12/2002 |
| JP | 2005-268431 A | 9/2005 |
| JP | 2006-013311 A | 1/2006 |
| JP | 2006-049524 A | 2/2006 |
| JP | 2009-021559 A | 1/2009 |
| JP | 2011-199219 A | 10/2011 |
| JP | 2014-063963 A | 4/2014 |

\* cited by examiner

METHOD OF MANUFACTURING A LIGHT-EMITTING DEVICE

CROSS-REFERENCE TO RELATED APPLICATIONS

This application claims priority to Japanese Patent Application No. 2018-203915, filed on Oct. 30, 2018, the disclosure of which is hereby incorporated by reference in its entirety.

BACKGROUND

Field

The present disclosure relates to a method of manufacturing a light-emitting device.

Description of the Related Art

In a known light-emitting device, a light-emitting element is disposed in a recess defined in a package, and the recess with the light-emitting element is sealed with a resin. In such a light-emitting device, if the resin wet-spreads outward of the recess, the portion of the resin located outside the recess causes glare, so that the display contrast may be decreased. To solve such a problem, for example, Japanese Patent Publication No. 2011-199219 describes disposing a dark color layer to cover the sealing member leaking around the recess of the package.

SUMMARY

Certain embodiments of the present invention allows for providing a method of manufacturing a light-emitting device that allows the sealing member to be prevented from extending outward of the recess.

In certain embodiments, a method of manufacturing a light-emitting device of the present invention can include providing a package having an upper surface and defining a recess, the recess having an opening at the upper surface. A light-emitting element is placed on a bottom surface of the recess of the package, and the recess of the package is filled with an uncured sealing member containing a silicone resin. The package is held in a liquid in a state in which the uncured sealing member is filled in the recess of the package, and the uncured sealing member is cured by heating the package in which the uncured sealing member is filled in the recess.

According to some embodiments, the sealing member can be prevented from extending outward of the recess.

DETAILED DESCRIPTION

Hereinafter, certain embodiments of a method of manufacturing a light-emitting device according to the present invention are described with reference to the drawings. The light-emitting devices described below are examples, and various modifications can be made to the light-emitting devices described below. The dimensions and shapes of components shown in the drawings may be exaggerated for ease of understanding. The dimensions, shapes, and relative sizes of components in an actual light-emitting device and manufacturing apparatus may not be reflected in the drawings. To avoid excessively complicated drawings, some components may not be shown in the drawings.

Figure 1:
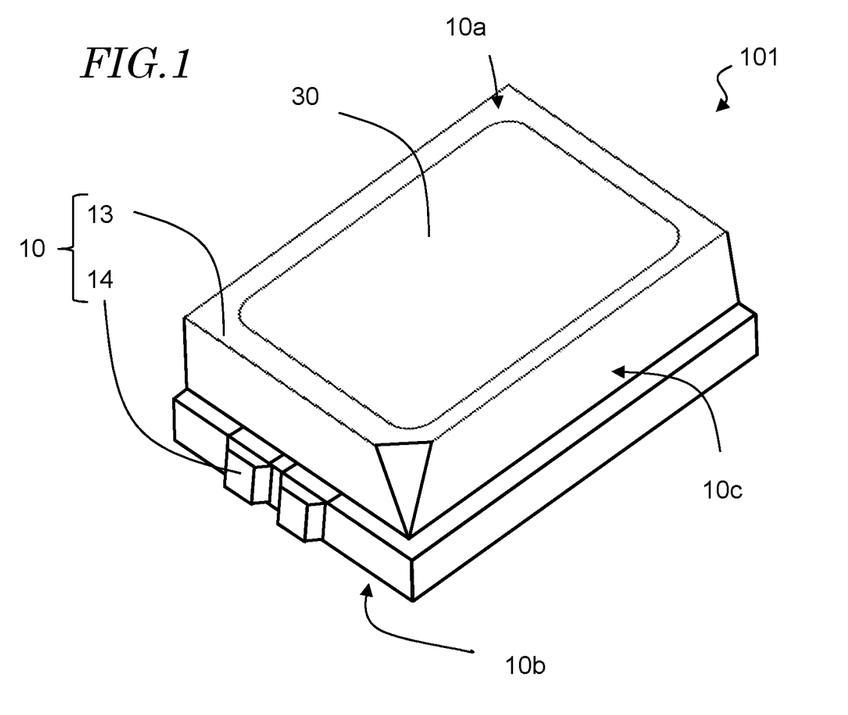
FIG. 1 is a perspective view schematically showing a light-emitting device manufactured by a method of manufacturing a light-emitting device of the present disclosure.
Figure 2A:
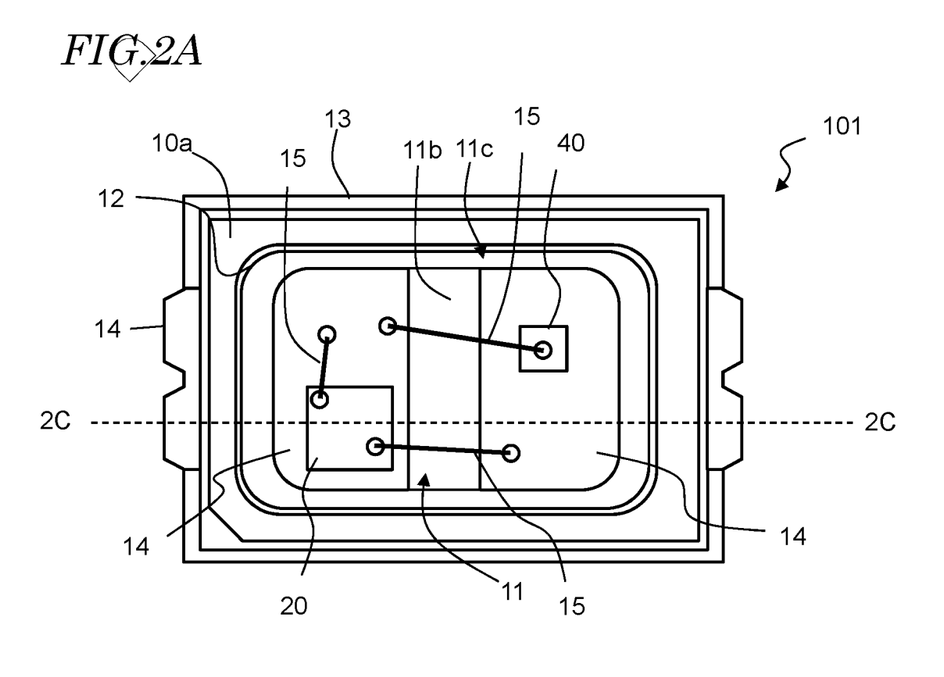
FIG. 2A is a plan view schematically showing a light-emitting device from which an sealing member has been removed.
Figure 2B:
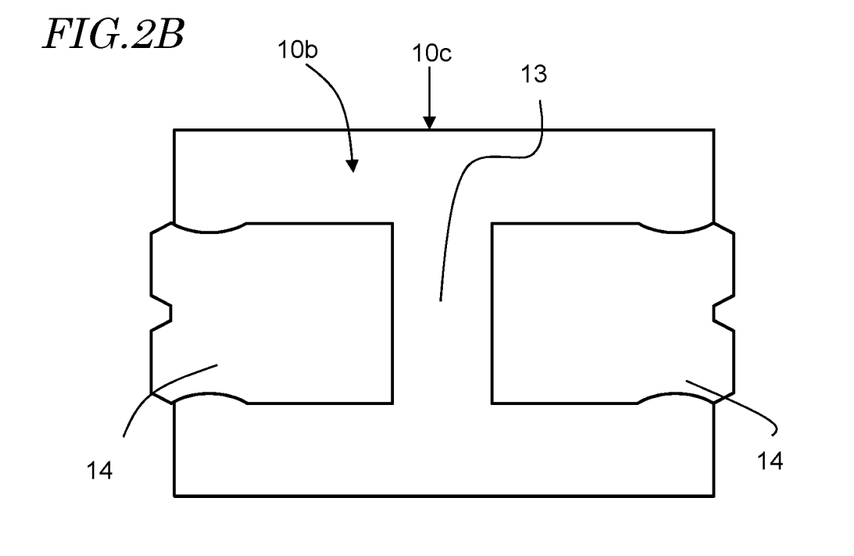
FIG. 2B is a bottom view schematically showing the light-emitting device.
Figure 2C:
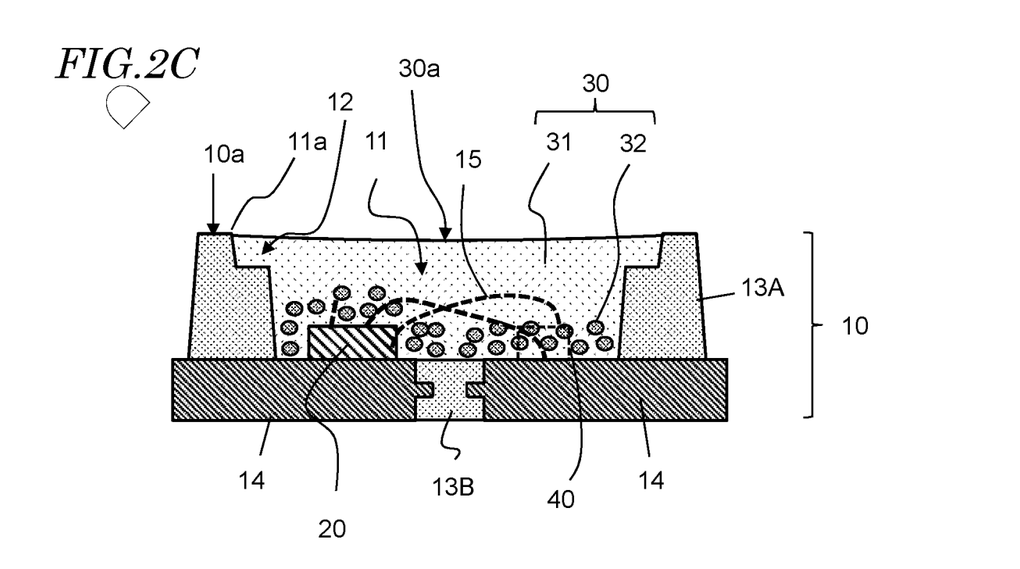
FIG. 2C is a cross-sectional view schematically showing the light-emitting device taken along line 2C-2C of FIG. 2A.

FIG. 1 is a perspective view schematically showing a light-emitting device manufactured by a method of manufacturing a light-emitting device in accordance with certain embodiments of the present invention. FIG. 2A is a plan view schematically showing a light-emitting device without a sealing member. FIG. 2B is a bottom view schematically showing the light-emitting device. FIG. 2C is a cross-sectional view schematically showing the light-emitting device taken along line 2C-2C of FIG. 2A.

The light-emitting device 101 includes a package 10, a light-emitting element 20, and a sealing member 30. The light-emitting device 101 may further include a protection element 40.

The package 10 functions as a casing for storing the light-emitting element 20. The package 10 has an upper surface 10a and a lower surface 10b, and defines a recess 11. The recess 11 has an opening 11a at the upper surface 10a. In some embodiments, the periphery of the upper surface 10a has a substantially rectangular shape. The package 10 has four lateral surfaces 10c that correspond to the four sides of the rectangle of the upper surface 10a.

In certain embodiments, the package 10 includes an insulating base 13 and a lead terminal 14. The base 13 forms a portion of the bottom surface 11b of the recess 11 and the lateral surfaces 11c of the recess 11. As shown in FIG. 2C, the lateral surfaces 11c of the recess 11 have a step portion 12. The inner lateral surfaces 11c may not have a step portion 12. Although the upper surface 10a of the package is shown as flat, the upper surface 10a may have irregularities or a groove or the like surrounding the opening 11a for antireflection. At the bottom surface 11b of the recess 11, a portion of the lead terminal 14 is exposed.

The base 13 is made of an insulating material. The base 13 can be made of a material which is unlikely to transmit light from the light-emitting element 20 and external light. The base 13 is a main part maintaining the structure of the package 10, and thus preferably has a predetermined strength. The base 13 can be made of, for example, a thermosetting resin, a thermoplastic resin, or a ceramic material. More specifically, the base 13 can be made of a resin material such as epoxy resin, silicone resin, phenolic resin, glass epoxy resin, BT resin, PPA, etc., or a ceramic material such as alumina, aluminum nitride, etc. Alternatively, in the base 13, the lateral surfaces 11c of the recess 11 may be made of a material that causes light emitted from the light-emitting element to be reflected at the lateral surfaces 11c. That is, the inner lateral surfaces 11c may be made of a material being different from a material of the external surfaces of the base and having a reflectance to light emitted from the light-emitting element higher than a reflectance of a material of the external surfaces of the base. This allows for improving the light extraction efficiency of the light-emitting device 101.

The lead terminal 14 functions as a terminal for electrically connecting the light-emitting element 20 with wiring or the like outside the package 10. The package 10 includes a plurality of lead terminals 14. A portion of each lead terminal 14 is exposed outside of the external surface of the package 10, while another portion of each lead terminal is buried in the base 13. In certain embodiments, the lead terminal 14 includes a protruding portion protruding from an external lateral surface 10e of the package 10. As will be described below, in manufacturing of the light-emitting device 101, a plurality of packages 10 are connected with a single leadframe via the protruding portions. With this structure, steps in the method of manufacturing a light-emitting device can be carried out over the leadframe, therefore, so that a plurality of light-emitting devices can be simultaneously manufactured.

As described above, each of the lead terminals 14 includes two opposite surfaces, such that one of the two opposite surface is partially exposed at the bottom surface 11b of the recess 11 and the other of the two opposite surface is partially exposed at the lower surface 10b of the package 10. The package 10 may include electrodes or wiring at a surface of the base 13 instead of the lead terminal 14.

A material having a relatively large thermal conductivity is preferably used for the lead terminals 14. With the lead terminal made of such a material, the heat produced in the light-emitting element 20 can be efficiently dissipated from the package 10. For example, the material used for the lead terminals 14 preferably has a thermal conductivity of approximately 200 W/(m·K) or more. Further, the material used for the lead terminals 14 preferably has a relatively large mechanical strength. For example, a metal plate of aluminum, iron, nickel, copper, or an alloy containing two or more of these metals, which is processed into a desired shape using pressing, punching, or etching, can be used. Further, a surface of the lead terminal 14 is preferably covered with a metal film such as, for example, Ag, Ag alloy, Au, Au alloy or the like. Further, a layer containing Ni can be disposed as an underlayer for the metal film. Examples of the underlayer include a layer containing Ni/Pd, or Ni/Au, or Ni/Pd/Au. Examples of the technique for forming the metal film include plating. When each of the lead terminals 14 includes such a metal film, the joining property with a reflective and/or electrically-conductive wire can be improved. The thickness of the lead terminal can be, for example, in a range of 110 μm to 250 μm. The lead terminal may include portions with varied thickness due to, for example, the processing described above.

The light-emitting element 20 can be a semiconductor light-emitting element, such as semiconductor laser, light-emitting diode, or the like. The light-emitting element 20 can have any appropriate thickness. For example, for blue and green light-emitting elements, a light-emitting element which contains ZnSe or a nitride-based semiconductor ($In_xAl_yGa_{1-x-y}N$, $0 \leq X$, $0 \leq Y$, $X+Y \leq 1$) can be used. For red light-emitting elements, a GaAs-based, AlInGaP-based, or AlGaAs-based semiconductor can be used. Alternatively, a semiconductor light-emitting element of other materials can be used. Composition, color of emitted light, size, and number of light-emitting elements used can be appropriately selected according to the desired application. For the light-emitting element, not only a light emitting element configured to emit visible light but also a light emitting element configured to emit ultraviolet or infrared light may be used.

As will be described later, the sealing member 30 may contain a wavelength conversion material. The wavelength conversion material can convert a portion or the entirety of light emitted from the light-emitting element 20 to light in a different wavelength range. In this case, the light-emitting device 101 can be configured to emit a mixture of light emitted from the light-emitting element 20 and light emitted from the wavelength conversion material, or is configured to emit only light emitted from the wavelength conversion material. For example, when the light-emitting element 20 emits blue light and the wavelength conversion material converts the blue light to yellow light, the light-emitting device 101 emits white light, resulting from mixture of the blue light and the yellow light. In certain embodiments, the light-emitting device 101 includes a single light-emitting element, although the light-emitting device 101 may include a plurality of light-emitting elements. For example, the light-emitting device 101 may include three light-emitting elements that are configured to emit red light, blue light and green light, respectively.

The light-emitting device 101 may further include an electronic component, such as a protection element, in addition to the light-emitting element 20. In certain embodiments, the light-emitting device 101 includes a protection element 40. The protection element 40 can be a zener diode and prevents the light-emitting element 20 from being broken by static electricity or the like.

In certain embodiments, the light-emitting element 20 is disposed on a lead terminal 14 that is exposed at the bottom surface 11b of the recess 11. Each of the anode and cathode electrodes of the light-emitting element 20 is electrically connected with a respective one of a pair of lead terminals 14 exposed at the bottom surface 11b of the recess 11 via a respective one of electrically-conductive wires 15. The protection element 40 includes electrodes each disposed on a respective one of the upper and lower surfaces of the protection element 40. The lower surface of the protection element 40 is bonded with the lead terminal 14 by an electrically-conductive bonding material such as solder, so that the electrode on the lower surface is electrically connected with corresponding one of the lead terminals 14. The electrode on the upper surface of the protection element 40 is electrically connected with the other lead terminal 14 by the electrically-conductive wire 15. With such wirings, the light-emitting element 20 and the protection element 40 are electrically connected in parallel.

The sealing member 30 is provided in the recess 11 and protects the light-emitting element 20, the electrically-conductive wire 15, the protection element 40 and other elements against moisture, external force, and dust. The sealing member 30 fills the recess 11 and covers the light-emitting element 20, the protection element 40, and the electrically-conductive wire 15 in the recess 11. As shown in FIG. 2C, the sealing member 30 is not provided on the upper surface 10a of the package 10.

The sealing member 30 can be light-transmissive so as to transmit light emitted from the light-emitting element 20. More specifically, the sealing member 30 preferably contains a silicone resin as a base material 31. Examples of the silicone resin include dimethyl silicone resins, methylphenyl silicone resins, and phenyl silicone resins. These silicone resins are generally hydrophobic. Alternatively, a hydrophobic modified silicone resin may be used.

The sealing member 30 may contain a filler in addition to the base material 31 described above. In certain embodiments, the sealing member 30 contains a wavelength conversion material 32 for the filler. Examples of the wavelength conversion material 32 include phosphors, quantum dots, etc. For the phosphors, known phosphors can be used. For example, yttrium aluminum garnet (YAG) activated with cerium, lutetium aluminum garnet (LAG) activated with cerium, and nitrogen-containing calcium aluminosilicate (CASN) activated with europium and/or chromium can be used. For the phosphor, a plurality of type of phosphors may be used alone or in various combinations. For example, using phosphors of different emission colors in a combination and at a blending ratio according to a desired color allows for adjusting color rendering or color reproduction.

The sealing member 30 may contain a light-reflecting material for the filler. Examples of the light-reflecting material include silicon oxide (silica), titanium oxide, magnesium oxide, zirconium oxide, barium titanate, and aluminum oxide. When the light-reflecting material is irradiated with light from the light-emitting element 20 or light emitted from the wavelength conversion material, the light-reflecting material reflects the light in random directions, which allows for reducing unevenness in luminance and unevenness in color of light emitted from the light-emitting device 101.

The sealing member 30 may contain a light-absorbing material for the filler to such an extent that the light transmissivity is not reduced. For the light-absorbing material, for example, a black pigment such as carbon black, graphite, etc can be used. With such a filler dispersed in the sealing member, unevenness in emission color of the light-emitting device 101 can be improved, and deterioration of the display contrast can be reduced.

The sealing member 30 may not contain the fillers described above, or may contain one or more types of fillers. With the fillers described above having a spherical shape, the fillers are likely to sedimented in the base material 31 when the base material 31 is in an uncured state. Therefore, protruding portions corresponding to the shape of the particles are unlikely to be formed at the surface of the sealing member 30, and light from the light-emitting element 20 is likely to be emitted without being scattered near the surface 30a of the sealing member 30. Thus, the extraction efficiency of light from the sealing member 30 can be improved.

Phosphoric characteristics of the phosphor used for the wavelength conversion material 32 may be deteriorated due to moisture in the external environment according to the composition of elements of the phosphor. When a phosphor of such characteristics is contained in the sealing member 30, using a phosphor with a spherical shape allows the phosphor to be located predominantly on the bottom surface 11b side of the recess 11 in the sealing member 30. Accordingly, the phosphor can be located as inward of the surface 30a of the sealing member 30, which is the boundary with the external environment, as possible. This allows for reducing deterioration due to moisture in the external environment.

When particles of the filler have a crushed shape, the particles have a surface area larger than a surface area of spherical particles of approximately equal size, which allows for hindering sedimentation of the filler particles in the uncured base material 31. Accordingly, the filler can be located near the surface of the sealing member 30, and irregularities in which the shape of the particles is reflected are likely to be formed at the surface of the sealing member 30. In this case, the sealing member 30 scatters reflected external light at the surface 30a, which allows for reducing decrease of the contrast due to the return of external light. Further, the filler can be uniformly dispersed throughout the base material 31.

Thus, when the sealing member 30 contains a plurality of types of fillers, according to the difference in the shapes of the filler particles, particles of one filler can be evenly dispersed throughout the sealing member 30 while particles of another filler are predominantly disposed on the bottom surface 11b side of the recess 11.

Figure 3:
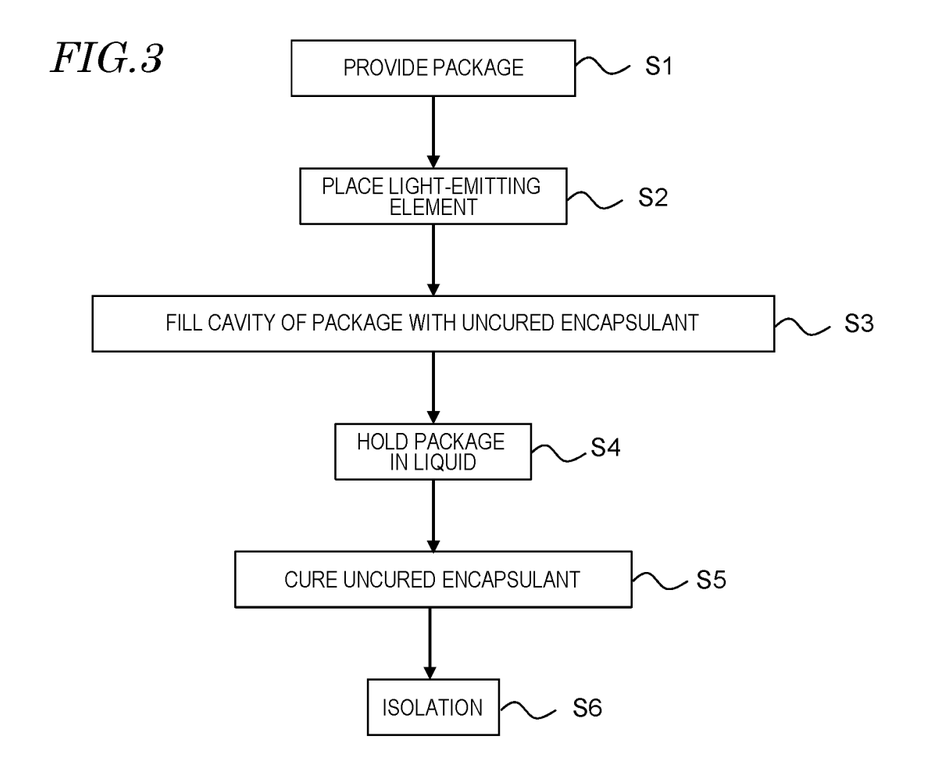
FIG. 3 is a flowchart illustrating a manufacture process in the method of manufacturing a light-emitting device of the present disclosure.
Figure 4A:
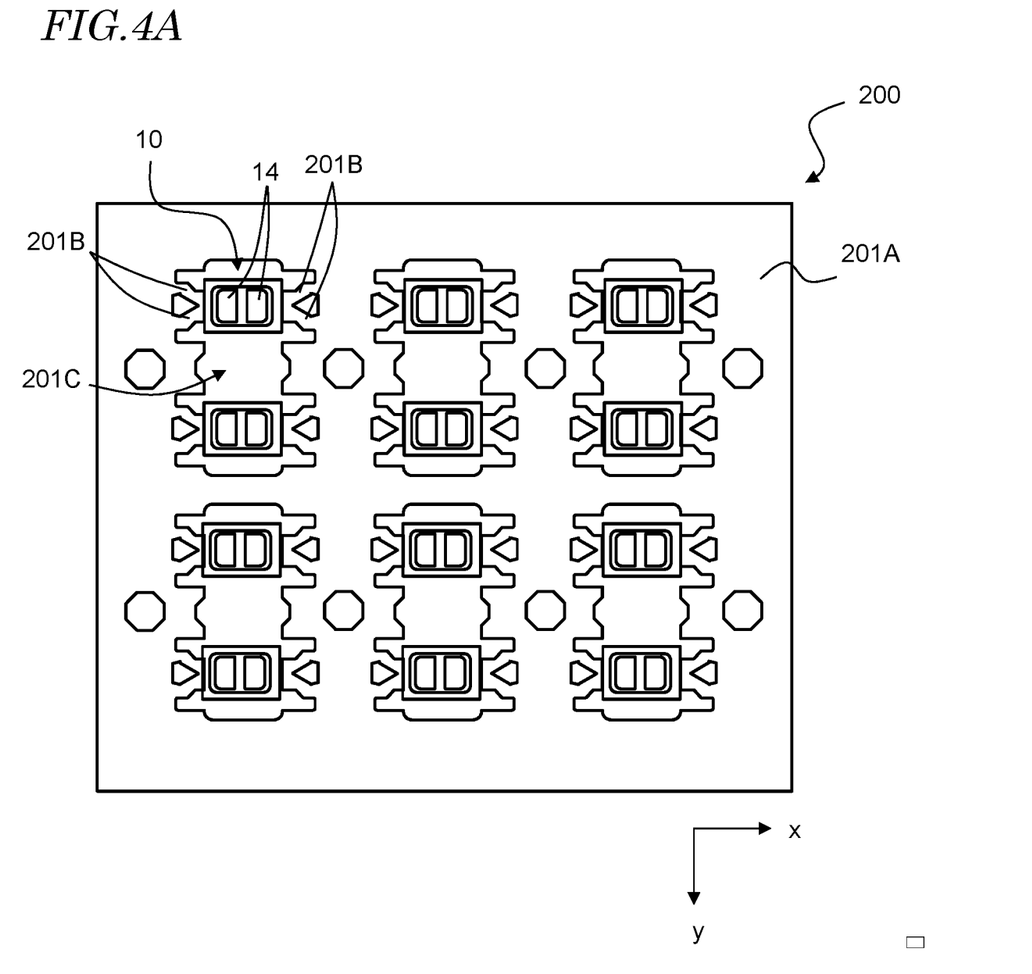
FIG. 4A is a plan view schematically showing a leadframe for use in the method of manufacturing a light-emitting device.

Next, a method of manufacturing the light-emitting device 101 according to embodiments of the invention will be described below. FIG. 3 is a flowchart illustrating steps in certain embodiments. FIG. 4B, FIG. 4C, FIG. 4D, FIG. 4E, FIG. 4F, FIG. 4G and FIG. 4H are cross-sectional views schematically illustrating steps in the method of manufacturing a light-emitting device. FIG. 4A and FIG. 4I are plan views schematically illustrating the certain embodiments.

A method of manufacturing a light-emitting device according to certain embodiments include (A) a step of providing a package, (B) a step of placing a light-emitting element in a package, (C) a step of filling with an uncured sealing member, (D) a step of holding the package in a liquid, and (E) a step of curing the uncured sealing member. Hereinafter, the respective steps are described in detail.

(A) Providing a Package (S1)

Figure 4B:
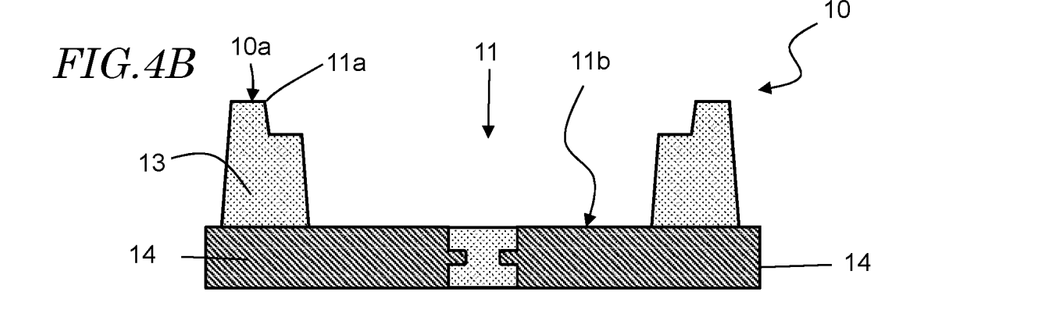
FIG. 4B is a cross-sectional view schematically illustrating the step of providing a package in the method of manufacturing a light-emitting device.

First, as shown in FIG. 4B, a package 10 having an upper surface 10a and defining a recess 11 is provided. The recess 11 has an opening 11a at the upper surface 10a. As described above, the package 10 includes lead terminals 14 and a base 13. Certain embodiments allow for manufacturing a single light-emitting device 101 and also allow for simultaneously manufacturing a plurality of light-emitting devices 101. When a plurality of light-emitting devices 101 are simultaneously manufactured, a plurality of packages 10 are provided. In view of improving the manufacture efficiency in mounting the light-emitting element 20 and filling with the sealing member 30, the plurality of packages 10 can be two-dimensionally arranged at predetermined intervals. For example, a supporting substrate which has an adhesive upper surface is provided, and the plurality of packages 10 are two-dimensionally arranged at predetermined intervals such that the lower surfaces 10b of the packages 10 are joined with the upper surface of the supporting substrate.

Alternatively, as shown in FIG. 4A, a leadframe 200 with a plurality of packages 10 may be provided. For example, the leadframe 200 includes a frame portion 201A to which the plurality of packages 10 are connected via the lead terminals 14. The frame portion 201A defines a plurality of through holes 201C, in which one or more packages 10 are disposed. In the frame portion 201A, the plurality of through holes 201C are, for example, two-dimensionally arranged in the x-direction and the y-direction.

In the example shown in FIG. 4A, two packages arranged in the y-direction are placed in each of the through holes 201C. Each lead terminal 14 in each package 10 is connected in the x-direction with the frame portion 201A, which surrounds the through holes 201C, via corresponding connecting portions 201B, so that each package 10 is connected with the frame portion 201A.

The leadframe 200 can be produced such that a leadframe in which the lead terminals 14 are connected with the frame portion 201A via the connecting portions 201B as described above are provided, and a base 13 is formed to cover each lead terminal 14 using, for example, insert molding.

(B) Placing a Light-Emitting Element in Each Package (S2)

Figure 4C:
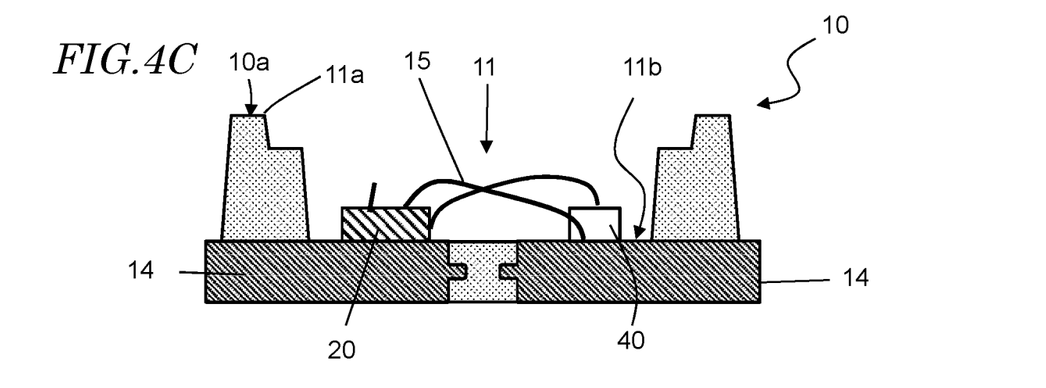
FIG. 4C is a cross-sectional view schematically illustrating the step of placing a light-emitting element in the method of manufacturing a light-emitting device.

As shown in FIG. 4C, a light-emitting element 20 is placed on the bottom surface 11b of the recess 11 of each package 10. The light-emitting elements 20 are provided, and each light-emitting element 20 is connected with the bottom surface 11b of a respective one of the recesses 11 using an adhesive material. In the present embodiment, each light-emitting element 20 is joined to the upper surface of one of a corresponding pair of lead terminals 14. In a similar manner, each protection element 40 is joined to the upper surface of the other lead terminal 14 of the corresponding pair of lead terminals 14. Next, each of a plurality of electrodes of each light-emitting element 20 is connected with a respective one of the corresponding pair of lead terminals 14 by a corresponding electrically-conductive wire 15. In a similar manner, each of the electrodes of the protection element 40 is connected with a respective one of the lead terminals 14 by a corresponding electrically-conductive wire 15.

(C) Filling with an Uncured Sealing Member (S3)

Figure 4D:
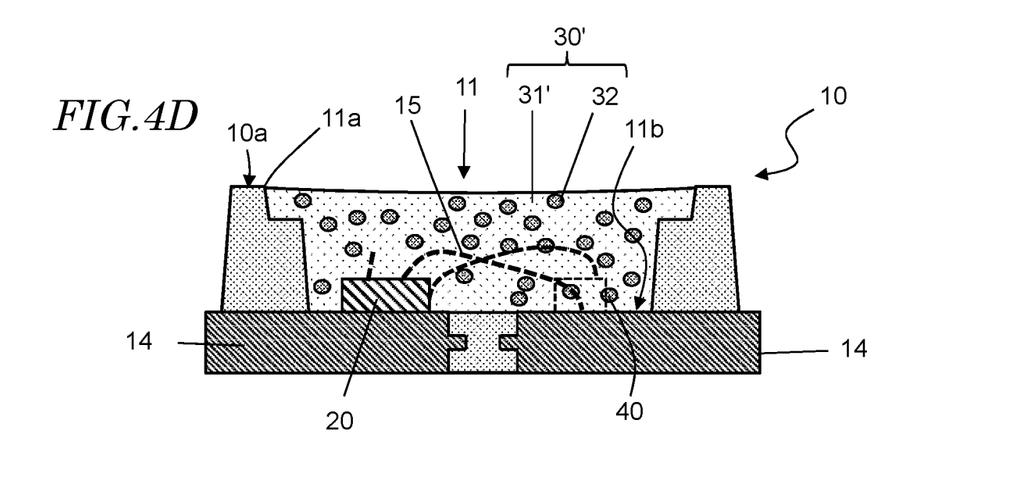
FIG. 4D is a cross-sectional view schematically illustrating the step of filling with an uncured sealing member in the method of manufacturing a light-emitting device.

As shown in FIG. 4D, the recess 11 of the package 10 is filled with an uncured sealing member which contains a silicone resin. First, an uncured sealing member 30' is prepared. The uncured sealing member 30' is prepared such that a wavelength conversion material 32 is added to an uncured silicone resin so that the wavelength conversion material 32 is dispersed in the uncured silicone resin. The resultant uncured sealing member 30' is filled into the recess 11 of the package 10 using a dispenser or the like. At this time, the uncured sealing member 30' is provided such that the uncured sealing member 30' does not leak from the opening 11a of the upper surface 10a of the package 10 and does not cover the upper surface 10a. It is preferable that the uncured sealing member 30' entirely covers the light-emitting element 20, the protection element 40 and the electrically-conductive wire 15 which are present in the recess 11. If the volume of the sealing member 30' is reduced by curing, the uncured sealing member 30' is filled in the recess 11 of the package 10 with consideration of shrinkage amount of sealing member 30'.

(D) Holding the Package in a Liquid (S4)

Figure 4E:
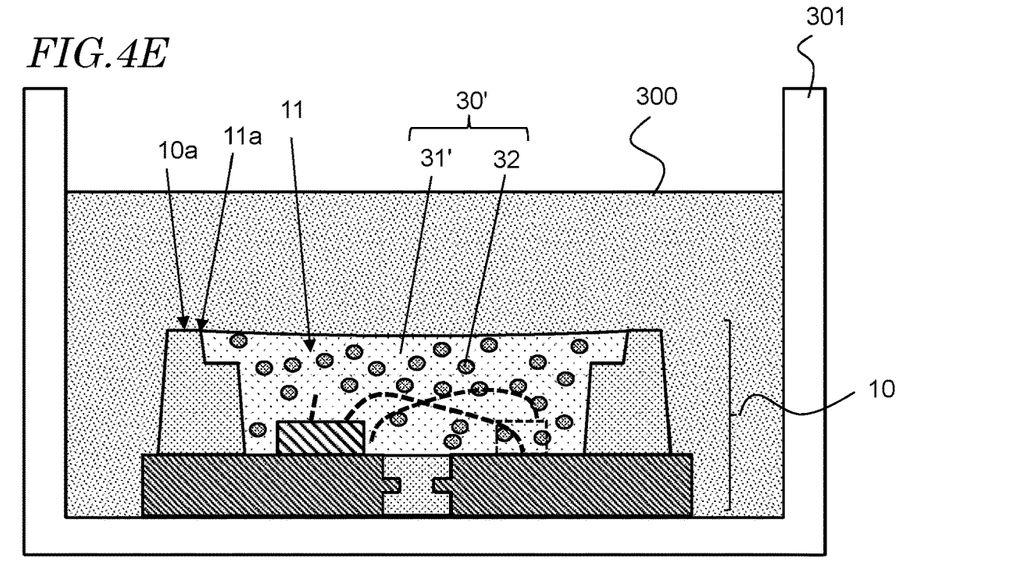
FIG. 4E is a cross-sectional view schematically illustrating the step of holding a package in a liquid in the method of manufacturing a light-emitting device.

The package 10 filled with the uncured sealing member 30' is held in a liquid. As shown in FIG. 4E, a container 301 containing the liquid 300 is provided, and the package 10 is immersed in the liquid 300 such that the package 10 is entirely covered with the liquid 300 and is left. In this step, the package 10 is preferably held substantially horizontal such that the uncured sealing member 30' is not moved by weight force.

While FIG. 4E shows the container 301 having such a size that allows for housing a single package 10, when a plurality of light-emitting devices 101 are simultaneously manufactured, a supporting substrate on which a plurality of packages are supported or a container 301 which has such a size that allows the above-described leadframe 200 to be held horizontally is provided. Alternatively, a rack in which a plurality of leadframes 200 can be horizontally stacked with predetermined intervals may be provided, and the rack on which the plurality of leadframes 200 are supported may be immersed in the liquid 300. According to this method, a plurality of leadframes 200 can be simultaneously processed.

For the liquid 300, a material that does not dissolve the silicone resin, which is the base material 31' of the uncured sealing member 30', is preferably used. More specifically, a hydrophilic liquid is preferably used for the liquid 300. For example, water, ethanol, acetone, or the like can be used. Further, toluene and silicone oil have a greater polarity than the silicone resin described above and has a relatively have a greater hydrophilicity, and thus can be used as the liquid 300. Accordingly, the liquid 300 preferably contains at least one selected from the group consisting of water, ethanol, acetone, toluene and silicone oil. Mixture of two or more of the liquids described above may be used for the liquid 300.

The liquid 300 is preferably used at such a temperature that curing of the base material 31' does not substantially occur. More specifically, the liquid 300 is preferably maintained at a temperature equal to or lower than a curing temperature of the silicone resin. For example, the liquid 300 is preferably maintained at a temperature equal to or lower than 60° C., more preferably at a temperature equal to or lower than 30° C. The expression "a curing temperature of the silicone resin" as used herein refers to a temperature at which an uncured silicone resin material is cured through thermal curing.

The package is held in the liquid for a duration according to a duration required between filling with the uncured sealing member 30' and curing of the uncured sealing member in manufacturing of the light-emitting device. In other words, in certain embodiments, when the package 10 is filled with the uncured sealing member 30' and then the package 10 is held for a predetermined duration without curing the uncured sealing member 30', the holding is carried out in a liquid.

Figure 4F:
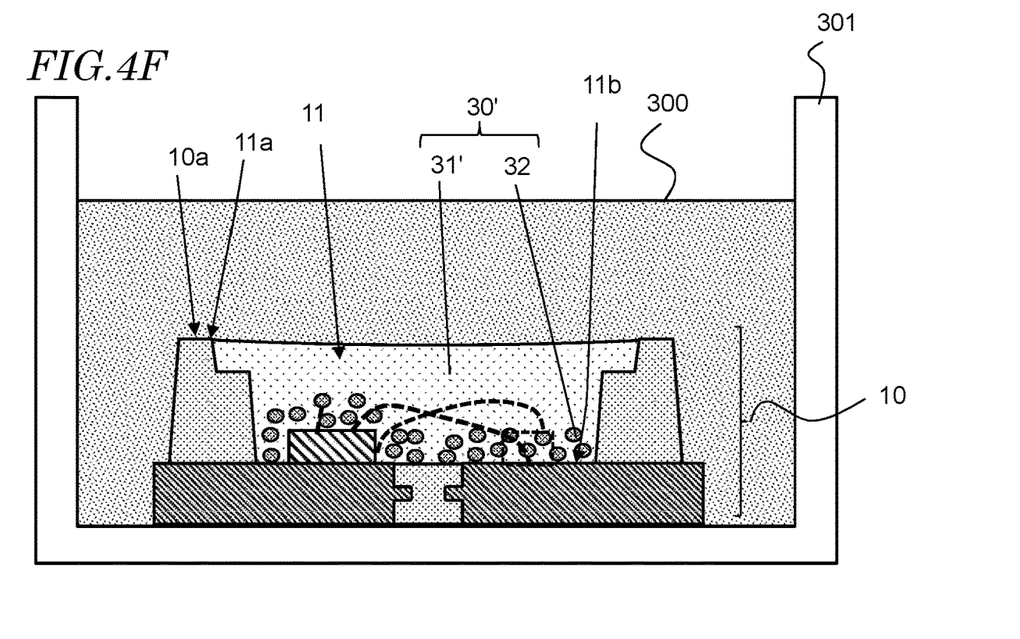
FIG. 4F is a cross-sectional view schematically illustrating the step of holding a package in a liquid in the method of manufacturing a light-emitting device.

For example, when the sealing member 30 contains a filler such as the wavelength conversion material 32 and the filler is to be sedimented, the package 10 is held in the liquid till the filler reaches the bottom. In certain embodiments, the sealing member 30 contains the wavelength conversion material 32, and the wavelength conversion material 32 is predominantly disposed on the bottom surface 11b side of the recess 11 in the package 10. Meanwhile, the package 10 filled with the uncured sealing member 30' is held in the liquid 300. The package 10 is held for a duration according to the depth of the recess 11, the particle diameter and shape of the wavelength conversion material 32, the amount of the wavelength conversion material 32 contained in the uncured sealing member 30', etc. For example, the package 10 can be held in the liquid 300 at room temperature for a duration in a range of 3 hours to 6 hours. This causes the wavelength conversion material 32 to be sedimented in the uncured sealing member 30' and to be predominantly disposed at the bottom surface 11b side of the recess 11 in the package 10, as shown in FIG. 4F.

While the package 10 is held in the liquid 300, the upper surface 10a of the package 10 is covered with the liquid 300. Accordingly, the uncured sealing member 30' is prevented from spreading over the upper surface 10a. In particular, due to hydrophilicity of the liquid 300, the uncured sealing member 30' that contains a hydrophobic uncured silicone resin is prevented from leaking out of the liquid 300 and flowing over the upper surface 10a through the opening 11a.

Figure 5:
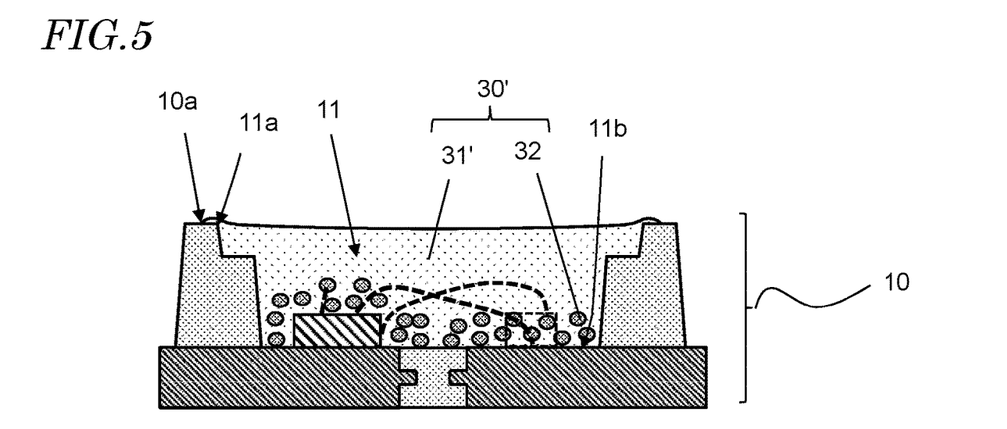
FIG. 5 is a schematic diagram schematically showing an uncured sealing member coming out over the upper surface of the package.

FIG. 5 schematically shows wet-spread of the uncured sealing member 30' on the upper surface of the recess 11 when the package 10 is left in the air between filling the recess 11 is with the uncured sealing member 30' and curing the sealing member 30'. When the package 10 is left in the air, the uncured sealing member 30' tends to remain at the periphery of the opening 11a (i.e., the boundary between the upper surface 10a of the package 10 and the inner lateral surfaces 11c of the recess 11) due to the surface tension immediately after being filled into the recess 11, but along with the passage of time, the uncured sealing member 30' conforms to the shape of the surface of the package and tends to wet-spread on the upper surface 10a of the package 10. Thus, due to the passage of time between filling with the resin and the curing, at least a portion of the upper surface 10a is likely to be covered with the uncured sealing member 30'. The longer the holding duration before the curing, the greater the wet-spread of the uncured sealing member 30' is. Accordingly, holding the package 10 in the liquid 300, allows for obtaining the effect of hindering wet-spread more easily than in a case where the package 10 is held in the air.

The purpose of holding the package 10 in the liquid 300 is not limited to sedimentation of the filler. The package 10 may be held in the liquid 300 for any other appropriate purposes. For example, when a large number of leadframes 200 are simultaneously processed, the leadframes 200 filled with the uncured sealing member 30' in the early stage of the manufacturing may be left for a relatively long time till starting the curing. In such a case, if the leadframes 200 are left in the air, wet-spread of the sealing member 30' as described above may occur. However, immersing the filled leadframes 200 in the liquid 300 and leaving allows for preventing wet-spread of the uncured sealing member 30'.

When the package 10 includes an insulating base and lead terminals 14, the uncured sealing member 30' may leak to the outside via a small gap between the lead and the base. However, even with such a configuration, performing, in the liquid 300, either or both leaving of the package 10 before curing and/or curing of the package 10 allows for preventing leakage of the uncured sealing member 30'.

(E) Curing the Uncured Sealing Member (S5)

Figure 4G:
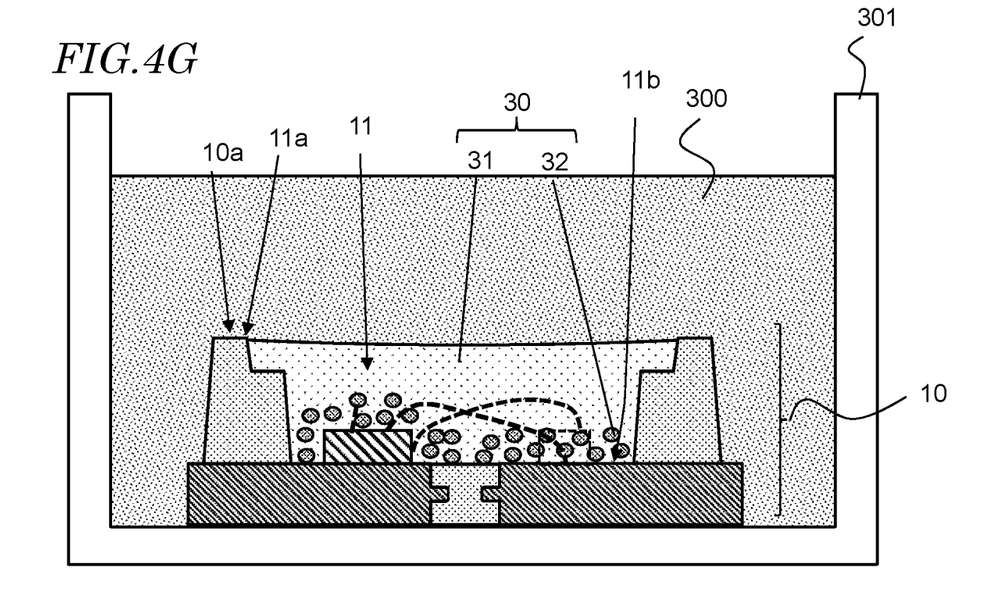
FIG. 4G is a cross-sectional view schematically illustrating the step of curing the uncured sealing member in the method of manufacturing a light-emitting device.

The package 10 in which the uncured sealing member 30' is filled is heated such that the uncured sealing member 30' is cured. For example, two methods can be used for performing this step. As shown in FIG. 4G, the liquid 300 may be heated while the package 10 is immersed in the liquid 300, so that the package 10 is heated in the liquid 300 to cure the uncured sealing member 30'. In this case, the container 301 can be heated by a heater, or a heater can be placed in the container 301 for directly heating the liquid 300. More specifically, the package 10 is heated by maintaining the liquid 300 at a temperature equal to or higher than the curing temperature of the silicone resin. For example, the uncured sealing member 30' is cured by maintaining the liquid 300 at 70° C. or higher. The heating duration is, for example, in a range of 0.5 hours to 4.0 hours. During the heating, the heating temperature can be lower than the boiling point of the liquid 300 in order to prevent the liquid 300 from boiling and from greatly flowing in the container 301. If the liquid 300 has a relatively high vapor pressure at the heating temperature although the heating temperature is lower than the boiling point, a lid may be placed over the opening of the container 301 such that dispersion of the vapor can be reduced. In view of heating, toluene and silicone oil have relatively high boiling points among the substances described above which can be used for the liquid 300, and accordingly can be preferably used when the uncured sealing member 30' is cured in the liquid 300.

Figure 4H:
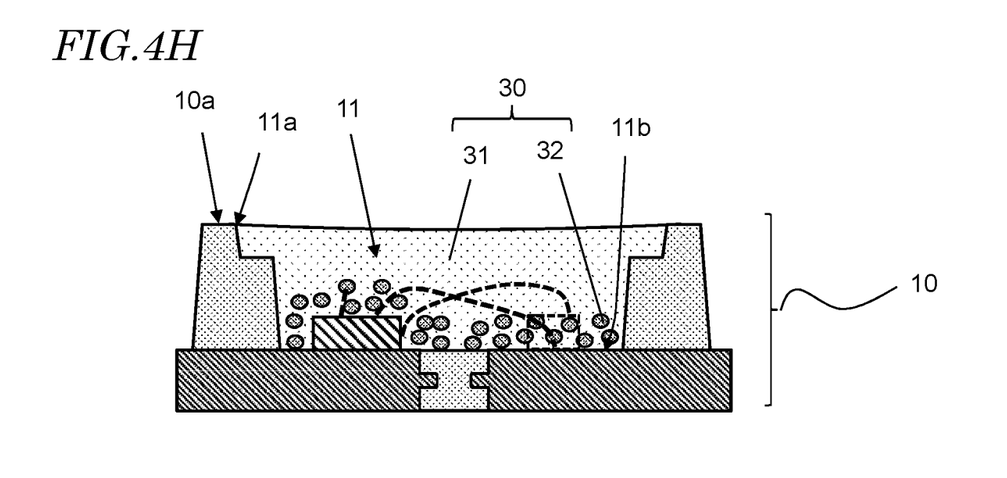
FIG. 4H is a cross-sectional view schematically illustrating the step of curing the uncured sealing member in the method of manufacturing a light-emitting device.
Figure 4I:
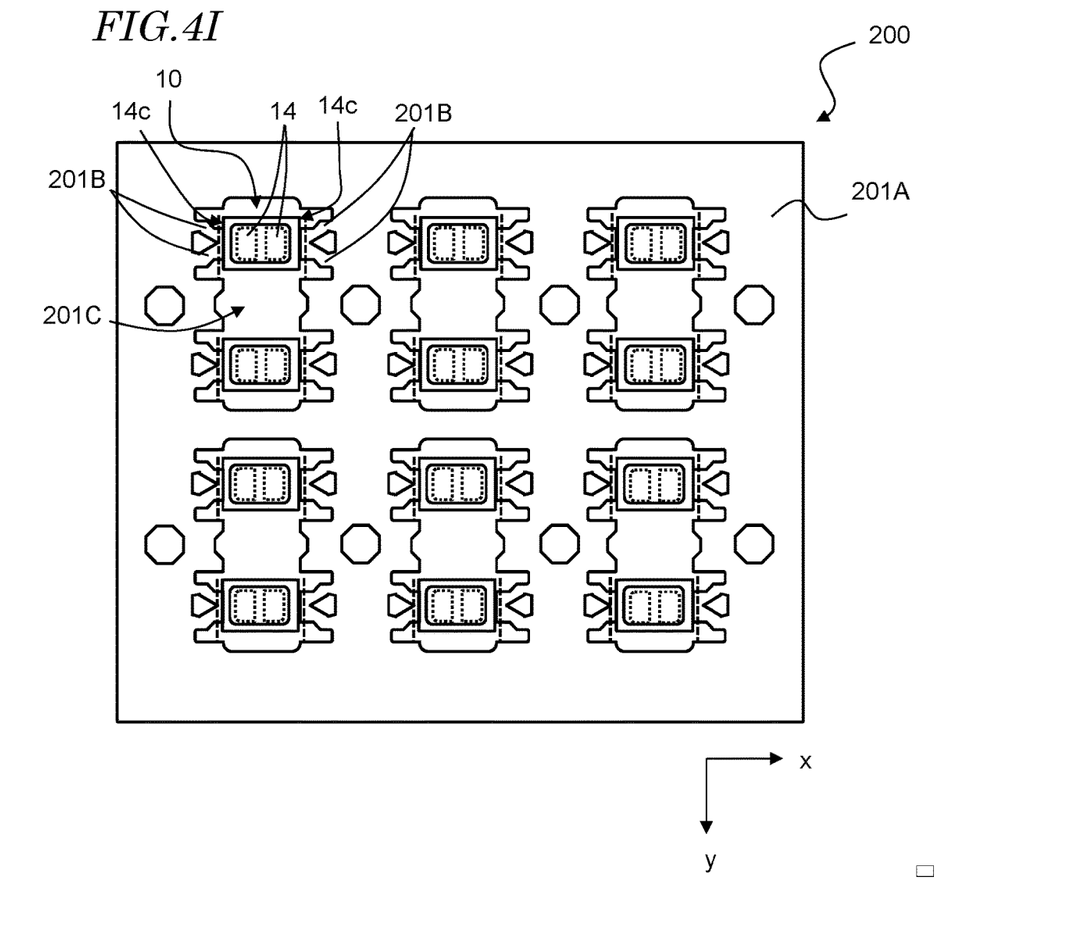
FIG. 4I is a plan view schematically showing a leadframe on which light-emitting devices are manufactured.

Alternatively, as shown in FIG. 4H, the uncured sealing member 30' may be cured by taking the package 10 out of the liquid 300 and heating the package 10 in a gas. In this case, for example, the package 10 taken out of the liquid 300 can be heated by holding the package 10 in a container that has a heater for maintaining the inside at a predetermined temperature, such as an oven.

By heating, the sealing member 30 is provided in the recess 11 of the package 10. As a result, a light-emitting device 101 is formed in which leakage of the sealing member 30 over the upper surface is prevented. When the light-emitting devices 101 are manufactured simultaneously for each leadframe 200, singulation is carried out subsequently.

(F) Step of Singulating the Devices (S6)

As shown in FIG. 4I, while the sealing member 30 is provided in the recess 11 of the package 10, leads of the leadframe 200 connecting the respective packages 10 are cut, so that the plurality of packages are singulated. More specifically, in FIG. 4I, as represented by broken lines, the connecting portions 201B are cut using a rotatable blade or the like at positions spaced apart from the lateral surfaces 10c of the package 10 such that the protruded portions of the lead terminals 14 are formed, so that the respective packages 10 are separated from each other. Accordingly, the light-emitting devices 101 are obtained.

As described above, according to certain embodiments of the present invention, an uncured sealing member is prevented from leaking out over the upper surface of the package, and accordingly the sealing member is prevented from being located on the upper surface of the package. This allows for, for example, reducing reflection of external light at the upper surface of the package, so that a light-emitting device of a good display contrast is obtained. When light-emitting devices in which the sealing member is provided on the upper surface of the package are handled in bulk, the sealing members at the upper surfaces of light-emitting devices are likely to come into contact with and adhere to one another. However, according to certain embodiments, such adhesion of the light-emitting devices with one another can be prevented.

Light-emitting devices according to embodiments of the present invention can be preferably used for light-emitting devices of various uses, such as illuminating devices, vehicles, display devices, electronic devices, etc.

The subject matter described above shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method of manufacturing a light-emitting device, said method comprising:
    providing a package having an upper surface and defining a recess, the recess having an opening at the upper surface;
    placing a light-emitting element on a bottom surface of the recess of the package;
    filling the recess of the package with an uncured sealing member containing a silicone resin;
    holding the package in a liquid in a state in which the uncured sealing member is filled in the recess of the package; and
    curing the uncured sealing member by heating the package in which the uncured sealing member is filled in the recess.

2. The method of claim 1, wherein the uncured sealing member contains a phosphor.

3. The method of claim 2, wherein the step of holding includes causing the phosphor to sediment in the uncured sealing member.

4. The method of claim 3, wherein in the causing the phosphor to sedimented, the liquid is maintained at a temperature equal to or lower than a curing temperature of the silicone resin.

5. The method of claim 1, wherein the curing is carried out in the liquid by maintaining the liquid at a temperature equal to or higher than a curing temperature of the silicone resin.

6. The method of claim 1, wherein the curing is carried out in a gas outside the liquid.

7. The method of claim 1, wherein the liquid contains at least one selected from water, acetone, ethanol, toluene and silicone oil.

8. The method of claim 1, wherein the silicone resin comprises a dimethyl silicone resin.

9. The method of claim 1, wherein
    in the providing the package, a leadframe to which a plurality of the packages are connected is provided,
    the placing the light-emitting element and the filling are carried out on the plurality of the packages, and wherein
    the holding and the curing are carried out over the leadframe.

10. The method of claim 9 further comprising, after the step of curing, singulating the plurality of packages.

11. The method of claim 1, wherein, in the step of holding, the package filled with the uncured sealing member is held in the liquid for a duration in a range of 3 hours to 6 hours.

* * * * *